(12) United States Patent
Smith

(10) Patent No.: US 6,844,758 B2
(45) Date of Patent: Jan. 18, 2005

(54) FREQUENCY SYNTHESIZER

(75) Inventor: Sterling Smith, Hsinchu (TW)

(73) Assignee: MStar Semiconductor Inc. (TW)

( * ) Notice: Subject to any disclaimer, the term of this patent is extended or adjusted under 35 U.S.C. 154(b) by 0 days.

(21) Appl. No.: 10/615,992

(22) Filed: Jul. 10, 2003

(65) Prior Publication Data

US 2004/0036509 A1 Feb. 26, 2004

Related U.S. Application Data

(60) Provisional application No. 60/395,339, filed on Jul. 12, 2002.

(51) Int. Cl.[7] .............................................. H03B 21/00
(52) U.S. Cl. ...................................... 327/105; 341/200
(58) Field of Search ................................ 327/105, 106, 327/107; 341/200; 375/240; 704/230

(56) References Cited

U.S. PATENT DOCUMENTS 4,862,173 A * 8/1989 Nishitani .................... 341/200
5,157,760 A * 10/1992 Akagiri ....................... 704/233
5,436,665 A * 7/1995 Ueno et al. ............. 375/240.14
5,896,101 A * 4/1999 Melanson ................... 341/143

* cited by examiner

Primary Examiner—Linh My Nguyen
(74) Attorney, Agent, or Firm—Michael D. Bednarek; Shaw Pittman LLP

(57) ABSTRACT

The present invention provides a frequency synthesizer comprising a noise-shaped quantizer and a divider. The noise-shaped quantizer is utilized for quantizing a period control word to a time-varying value. The divider is used for generating an output signal by of dividing a reference signal by the time-varying value. The output signal is fed back to the noise-shaped quantizer so that the noise-shaped quantizer generates the time-varying value in response to the feedback output signal. Accordingly, the frequency synthesizer of the present invention can provide a very precise frequency synthesizer featuring very accurate long-term phase, frequency, and jitter stability.

15 Claims, 2 Drawing Sheets

US 6,844,758 B2

FREQUENCY SYNTHESIZER

CROSS-REFERENCE TO RELATED APPLICATION

The present application claims the priority benefits of U.S. provisional application entitled "DIGITAL FREQUENCY SYNTHESIZER" filed on Jul. 12, 2002 Ser. No. 60/395,339. All disclosures of this application are incorporated herein by reference.

BACKGROUND OF THE INVENTION

1. Field of the Invention

The present invention generally relates to a frequency synthesizer. More particular, the present invention relates to a very precise frequency synthesizer featuring very accurate long-term phase and frequency.

2. Description of Related Arts

The conventional digital frequency synthesizer utilizes a delta-sigma fractional divider in PLL feedback loop and operates on N, N+1 basis, and usually PLL input is direct from crystal such as 14 MHz or 20 MHz. This results in jitter at much lower offset frequencies that requires larger area to suppress.

SUMMARY OF THE INVENTION

It is therefore an object of the present invention to provide a very precise frequency synthesizer featuring very accurate long-term phase and frequency.

It is another object of the present invention to provide a very precise frequency synthesizer featuring jitter stability.

To attain this object, the present invention provides a frequency synthesizer comprising a divider, a noise-shaped quantizer and a filter. The divider is used for receiving a reference clock with a substantially fixed period and generating an output clock with a time-varying period. The noise-shaped quantizer is employed for quantizing a period control word to a time-varying value in response to the output clock fed from the divider so that the divider generates the output clock by means of dividing the reference clock by the time-varying value. The filter is used for substantially filtering out jitter from the output clock.

Moreover, the present invention provides a frequency synthesizer comprising a noise-shaped quantizer and a divider. The noise-shaped quantizer is utilized for quantizing a period control word to a time-varying value. The divider is used for generating an output signal by means of dividing a reference signal by the time-varying value. The output signal is fed back to the noise-shaped quantizer so that the noise-shaped quantizer generates the time-varying value in response to the feedback output signal.

Accordingly, the frequency synthesizer of the present invention can provide a very precise frequency synthesizer featuring very accurate long-term phase, frequency, and jitter stability.

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. The preferred embodiments are described in sufficient detail to enable these skilled in the art to practice the invention, and it is to be understood that other embodiments may be utilized and that logical changes may be made without departing from the spirit and scope of the present invention. The following detailed description is, therefore, not to be taken in a limiting sense, and the scope of the present invention is defined only by the appended claims.

Figure 1:
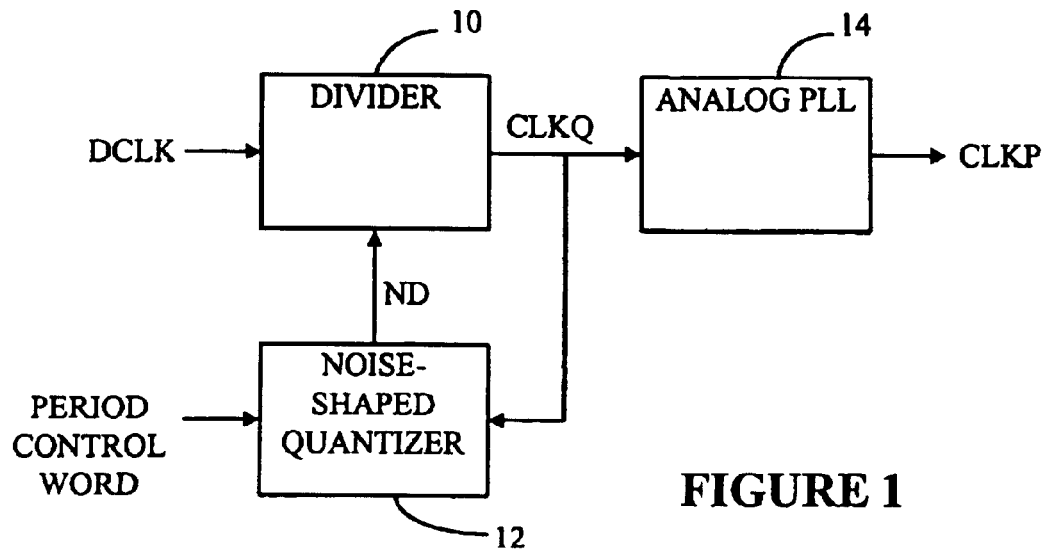
FIG. 1 schematically illustrates a block diagram of a frequency synthesizer in accordance with one preferred embodiment of the present invention.

Referring to FIG. 1, a block diagram of a frequency synthesizer in accordance with one preferred embodiment of the present invention is schematically illustrated. In FIG. 1, the frequency synthesizer of the present invention comprises a divider 10, a noise-shaped quantizer 12 and an analog phase locked loop (PLL) device 14. A high speed very stable digital clock DCLK, normally based on a crystal oscillator reference, is employed as a stable reference baseline period. The reference clock DCLK provided with a higher frequency will give the preferable results. For example, in the application of flat panel display controllers, 200 MHz or above can be provided for the reference clock DCLK.

In order to obtain a desired output clock frequency, the reference clock DCLK is received and divided by a time-varying value ND(t) in the divider 10 so as to generate an output clock CLKQ having a time-varying period TD(t). Although the output clock CLKQ has the time-varying period TD(t), the time-varying algorithm will be arranged to give the output clock CLKQ a very precise average period such that precise average output clock frequency can be obtained. As shown in FIG. 1, the output clock CLKQ is fed back to the noise-shaped quantizer 12 which receives a period control word. The noise-shaped quantizer 12 is employed to quantize the period control word to the time-varying value ND(t) in response to the feedback output clock CLKQ. According to the present invention, the noise-shaped quantizer 12 can be a delta-sigma quantizer so that the time-varying value ND(t) is spectrally shaped by the noise-shaped quantizer 12 using a digital delta-sigma algorithm. Preferably, the period control word is configured with a bit resolution greater than that of the time-varying value ND(t). In this preferred embodiment, the period control word is a precise word of 24-bit resolution which is quantized into a low precision value ND(t) of 5-bit resolution.

As mentioned above, the noise-shaped quantizer 12 of the present invention converts the high resolution input, that is, the period control word, to the low resolution output ND(t) in such a way as to spectrally shape the quantization error, most of which is at very high frequency range. Noted that the quantization error is directed to the difference between the period control word and time-varying integer value ND(t). With delta-sigma quantization, the spectral density of the quantization error in ND(t) or TD(t) is very low at low frequencies and rises with increasing frequency. In some systems no further processing need be done to the output clock CLKQ if cycle-cycle jitter is not critical. In other systems, the output clock CLKQ may not be useful as a low jitter output clock due to the large amount of jitter from the time-varying nature of the period TD(t). To reduce the jitter, the output clock CLKQ may be input to the analog PLL 14 which can filter the jitter to produce a stable output clock CLKP. If the spectral properties of the time-varying period TD(t) are properly designed, the amount of jitter reduction from the analog PLL 14 can be very significant. In other words, the output clock CLKQ can be filtered by using the analog PLL 14 to suppress the high frequency jitter if the cycle-cycle jitter is a design concern. Thus, the analog PLL 14 serves as a filter means for effectively filtering the jitter from the output clock CLKQ.

Moreover, the divider 10 can take any value between minimum and maximum given by the noise-shaped quantizer 12. Thus, using the time-varying divider 10 to divide down the high frequency fixed-period clock reference clock DCLK to synthesize a precise long-term average frequency output clock CLKQ directly in digital domain. Therefore, the average period of the output clock CLKQ or the filtered output clock CLKP is kept very precise.

Figure 2:
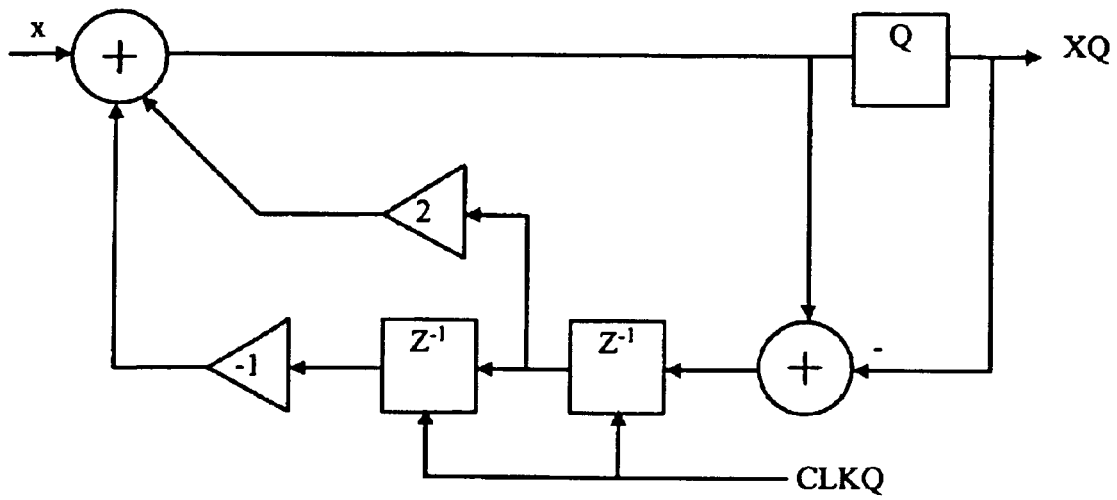
FIG. 2 depicts a detailed circuit diagram of the noise-shaped quantizer of FIG. 1 as an example.

Referring to FIG. 2, a detailed block diagram of the noise-shaped quantizer of FIG. 1 is schematically depicted as an example. In FIG. 2, a delta-sigma quantizer is exemplified in $2^{nd}$-order shaping for reference. However, such a detailed example is not to be taken in a limiting sense, and it is to be understood that other embodiments may be utilized and that logical changes may be made without departing from the spirit and scope of the present invention.

Figure 3:
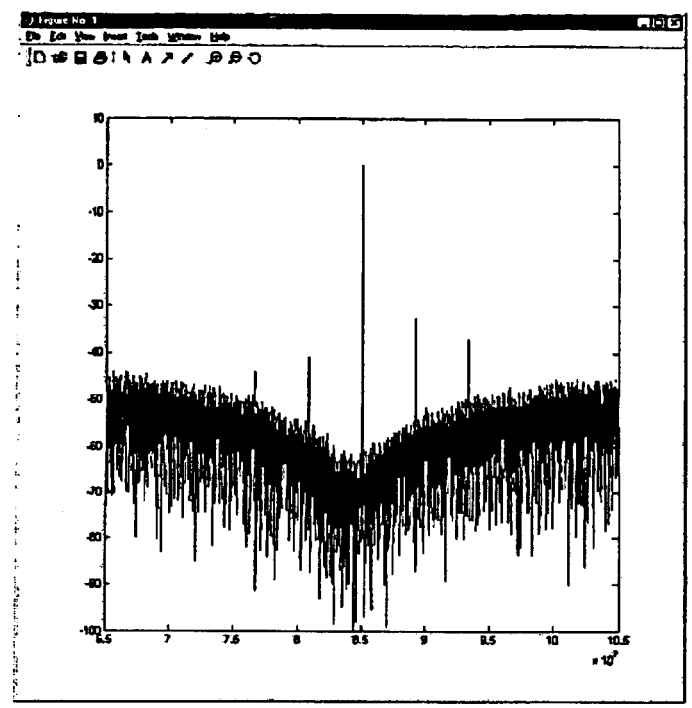
FIG. 3 depicts a power spectral plot diagram of the output clock CLKQ.
Figure 4:
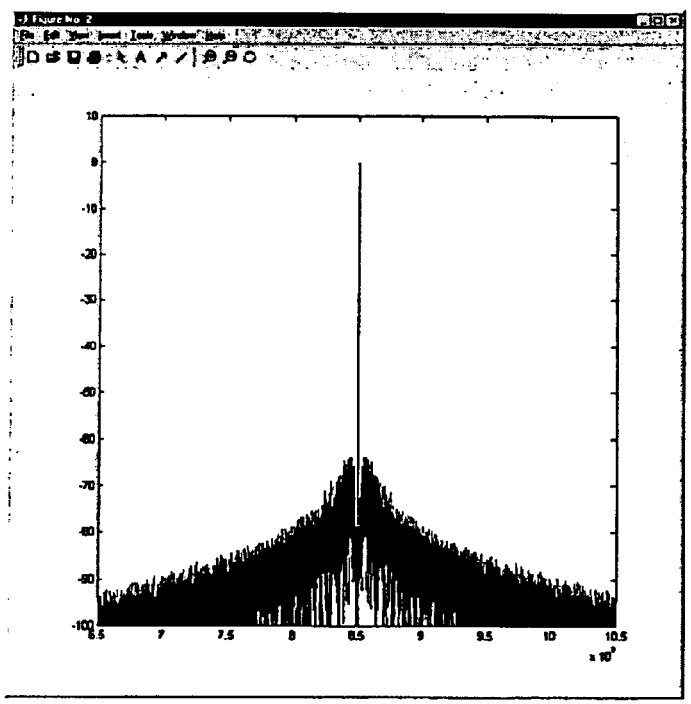
FIG. 4 depicts a power spectral plot diagram of the output clock CLKP.

FIGS. 3 and 4 depict power spectral plot diagrams of CLKQ and CLKP, respectively, where y-axis is dBc and x-axis is frequency. These simulation FIGS. 3 and 4 are plotted upon DCLK=214.6 MHz, the period control word= 0×2864d2 (fractional divider equivalent=0×05.0C9A4), M (feedback divider for the analog PLL 14)=2 and the required CLKP =85 MHz. By comparing FIGS. 3 and 4, the use of the analog PLL 14 as the jitter low pass filter to filter out the high frequency jitter from the output clock CLKQ. Thus, the low-jitter output clock CLKP can be produced such that aliasing effect can be suppressed effectively.

Accordingly, the frequency synthesizer, in accordance with the present invention, uses the time-varying divider 10 to divide down the high frequency fixed-period clock reference clock DCLK to synthesize the precise long-term average frequency output clock CLKQ directly in digital domain. Therefore, no look-up table, digital-to-analog converter, phase locked loop or delay locked loop is required for the divider 10. Also, no conventional approach of N, N+1 divider is required for the frequency synthesizer of the present invention.

Moreover, the frequency synthesizer of the present invention uses the delta-sigma algorithm to quantize the precise period control word to the low precision time-varying integer value ND(t). Such a way forces most of the jitter of the reference clock DCLK to be at high frequency by making the divider value ND(t) be selected from a set of small integer values. In addition, higher frequency jitter decreases the cost of the subsequent jitter low-pass filtering block when required. If the frequency of the reference clock DCLK is chosen properly, the required integer values can be less than 60 for the time-varying value ND(t).

Furthermore, the frequency synthesizer of the present invention uses the very precise digital input, that is, the high resolution period control word, to the noise-shaped quantizer 12 to ensure that the average period of the output clocks CLKQ and, subsequently, CLKP are kept very precise.

Though no further processing need be done to the output clock CLKQ if cycle-cycle jitter is not critical in some systems, the output clock CLKQ can be filtered by using the analog PLL 14 to suppress the high frequency jitter when the cycle-cycle jitter is a design concern. The frequency synthesizer of the present invention uses the analog PLL 14 as the jitter low pass filter to filter out the high frequency jitter from the output clock CLKQ to produce low-jitter output clock CLKP.

Although the description above contains much specificity, it should not be construed as limiting the scope of the invention but as merely providing illustrations of some of the presently preferred embodiments of the present invention. Thus, the scope of the present invention should be determined by the appended claims and their equivalents, rather than by the examples given.

What is claimed is:

1. A frequency synthesizer, comprising:
   a divider for receiving a reference clock with a substantially fixed period and generating an output clock with a time-varying period;
   a noise-shaped quantizer for quantizing a period control word to a time-varying value in response to said output clock fed from said divider so that said divider generates said output clock by means of dividing said reference clock by said time-varying value; and
   a filter for substantially filtering out jitter from said output clock,
   wherein said period control word has a bit resolution greater than that of said time-varying value.

2. The frequency synthesizer as claimed in claim 1, wherein said noise-shaped quantizer is a delta-sigma quantizer.

3. The frequency synthesizer as claimed in claim 1, wherein said filter is an analog phase locked loop (PLL) device as a low pass filter for removing high frequency jitter from said output clock.

4. A frequency synthesizer, comprising:
   a noise-shaped quantizer for quantizing a period control word to a time-varying value; and
   a divider for generating an output signal by means of dividing a reference signal by said time-varying value, said output signal feeding back to said noise-shaped quantizer so that said noise-shaped quantizer generates said time-varying value in response to said feedback output signal,
   wherein said period control word has a bit resolution greater than that of said time-varying value.

5. The frequency synthesizer as claimed in claim 4, further comprising a filter for of significantly filtering out jitter from said output signal.

6. The frequency synthesizer as claimed in claim 5, wherein said filter is an analog phase locked loop (PLL) device as a low pass filter for removing high frequency jitter from said output signal.

7. The frequency synthesizer as claimed in claim 4, wherein said reference signal is a reference clock with a substantially fixed period.

8. The frequency synthesizer as claimed in claim 4, wherein said output signal is an output clock with a time-varying period and a substantially precise long-term average frequency.

9. The frequency synthesizer as claimed in claim 4, wherein said noise-shaped quantizer is a delta-sigma quantizer.

10. A frequency synthesizer, comprising:
    means for quantizing a period control word to a time-varying value; and
    means for generating an output signal by means of dividing a reference signal by said time-varying value, said output signal feeding back to said means for quantizing said period control word so that said time-varying value is generated in response to said feedback output signal, wherein said period control word has a bit resolution greater than that of said time-varying value.

11. The frequency synthesizer as claimed in claim 10, further comprising means for of significantly filtering out jitter from said output signal.

12. The frequency synthesizer as claimed in claim 11, wherein said means for filtering the jitter is an analog phase locked loop (PLL) device as a low pass filter for removing high frequency jitter from said output signal.

13. The frequency synthesizer as claimed in claim 10, wherein said reference signal is a reference clock with a substantially fixed period.

14. The frequency synthesizer as claimed in claim 10, wherein said output signal is an output clock with a time-varying period and a substantially precise long-term average frequency.

15. The frequency synthesizer as claimed in claim 10, wherein said means for quantizing said period control word is a delta-sigma quantizer.

* * * * *